(12) United States Patent
Choi

(10) Patent No.: US 8,981,701 B2
(45) Date of Patent: Mar. 17, 2015

(54) APPARATUS AND METHOD FOR COMPENSATING OFFSET OF CURRENT SENSOR

(71) Applicant: LSIS Co., Ltd., Anyang-si, Gyeonggi-do (KR)

(72) Inventor: Gi Young Choi, Seongnam-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 219 days.

(21) Appl. No.: 13/711,475

(22) Filed: Dec. 11, 2012

(65) Prior Publication Data

US 2013/0154526 A1   Jun. 20, 2013

(30) Foreign Application Priority Data

Dec. 19, 2011   (KR) .................. 10-2011-0137304

(51) Int. Cl.
*G05B 11/28* (2006.01)
*H02P 6/00* (2006.01)
*G01R 35/00* (2006.01)
*G01R 19/00* (2006.01)

(52) U.S. Cl.
CPC .............. *H02P 6/002* (2013.01); *G01R 35/005* (2013.01); *G01R 19/0092* (2013.01)
USPC . 318/599; 318/811; 318/400.01; 318/400.02; 318/400.22; 318/801; 388/811; 388/819

(58) Field of Classification Search
USPC ............... 318/400.01, 400.22, 599, 701, 721, 318/799, 801, 430, 432, 437, 811; 388/804, 388/806, 811, 819
See application file for complete search history.

(56) References Cited

U.S. PATENT DOCUMENTS

| | | | | |
|---|---|---|---|---|
| 7,843,162 B2* | 11/2010 | Bae et al. | ........................ | 318/801 |
| 2006/0097676 A1* | 5/2006 | Katahira | ........................ | 318/432 |
| 2008/0265819 A1 | 10/2008 | Chen et al. | | |
| 2009/0189553 A1* | 7/2009 | Arnet | ........................ | 318/400.3 |
| 2010/0295492 A1 | 11/2010 | Chakrabarti et al. | | |

FOREIGN PATENT DOCUMENTS

| | | |
|---|---|---|
| CN | 1264211 | 8/2000 |
| CN | 101895245 | 11/2010 |
| EP | 2485381 | 8/2012 |
| JP | 200023490 | 1/2000 |

(Continued)

OTHER PUBLICATIONS

Korean Intellectual Property Office Application Serial No. 10-2011-0137304, Office Action dated Oct. 26, 2012, 3 pages.
European Patent Office Application Serial No. 12196538.8, Search Report dated Apr. 15, 2013, 6 pages.

(Continued)

*Primary Examiner* — Antony M Paul
(74) *Attorney, Agent, or Firm* — Lee, Hong, Degerman, Kang & Waimey

(57) ABSTRACT

Provided is an apparatus for compensating offset of a current sensor detecting a motor current supplied by an inverter for PWM (Pulse Width Modulation) control of a motor, the apparatus including a current controller providing a PWM signal generated based on the motor current detected by the current sensor to the inverter, calculating an offset using the motor current detected by the current sensor in response to presence and absence of the PWM control of the motor, or offset-compensating the motor current detected by the current sensor.

8 Claims, 2 Drawing Sheets

(56) References Cited

FOREIGN PATENT DOCUMENTS

| | | |
|---|---|---|
| JP | 2004264298 | 9/2004 |
| KR | 10-1999-0071005 | 9/1999 |
| KR | 10-2007-0096361 | 10/2007 |
| WO | 2011036896 | 3/2011 |

OTHER PUBLICATIONS

Japan Patent Office Application Serial No. 2012-275653, Office Action dated Mar. 11, 2014, 2 pages.

The State Intellectual Property Office of the People's Republic of China Application Serial No. 201210596812.8, Office Action dated Sep. 19, 2014, 8 pages.

* cited by examiner

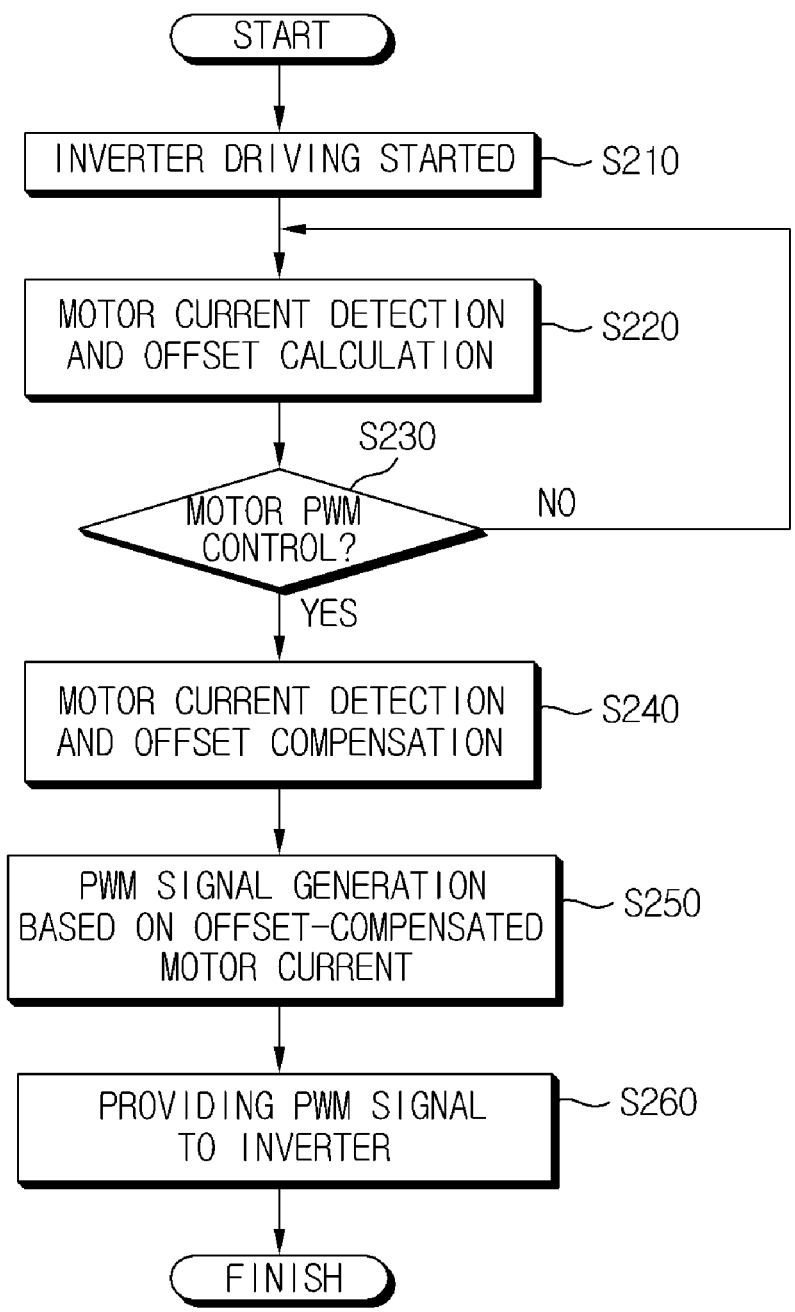

APPARATUS AND METHOD FOR COMPENSATING OFFSET OF CURRENT SENSOR

CROSS-REFERENCE TO RELATED APPLICATIONS

Pursuant to 35 U.S.C. §119 (a), this application claims the benefit of earlier filing date and right of priority to Korean Patent Application No. 10-2011-0137304, filed on Dec. 19, 2011, the contents of which are hereby incorporated by reference herein in its entirety.

BACKGROUND OF THE INVENTION

1. Field of the Invention

The present invention relates to a method for compensating offset of current sensor, and more particularly to a method for compensating offset of current sensor configured to be used for a current sensor for detecting a current flowing in a motor of a driving power source for hybrid electric vehicles (HEVs) and electric vehicles (EVs).

2. Discussion of the Related Art

The information disclosed in this Discussion of the Related Art section is only for enhancement of understanding of the general background of the present invention and should not be taken as an acknowledgement or any form of suggestion that this information forms the prior art already known to a person skilled in the art.

In recent years, with the aim of reducing $CO_2$ discharge in an attempt to prevent global warming and air pollution, hybrid electric vehicles (HEVs) and electric vehicles (EVs) have gained great attention as eco-friendly vehicles.

HEVs are mounted with a motor driven by electricity, in addition to a conventional engine as power supply source. To be more specific, a power supply system of an HEV includes a main battery (high voltage battery) supplying a driving power to a driving motor, a BMS (Battery Management System), a sub-battery (low voltage battery) providing a driving power to other vehicular electronic equipment and a host of electric devices.

An inverter may act as an intermediary between battery and electric motor. That is, an inverter converts a high DC (direct current) voltage generated by the main battery (high voltage battery) to an AC (alternating current) signal to control a motor. That is, the HEVs are mounted with as power supply sources a DC power source, an inverter and a motor driven by the inverter.

In the HEVs or EVs, an MCU (Motor Control Unit) precisely controls the motor based on a detection value of output torque of a motor, and a detection value of motor current flowing in the motor. Meanwhile, a motor current detected by a current sensor has a predetermined difference from a current actually flowing in the motor, which is called an offset of the current sensor. The offset of the current sensor is a very small amount of current necessary for operating the current sensor, and a motor current detected by the current sensor actually includes a current flowing in the motor and the offset, such that the offset is compensated by the motor current detected by the current sensor.

If a motor current that has not compensated the offset is provided to the MCU, a pulsation of a motor output torque may be caused by an error between detected current by the current sensor and actual current flowing in the motor, whereby an entire system may be destabilized. Generally, as a measure to combat this phenomenon, an offset is predetermined at an initial driving of a motor, and an offset is compensated to the current detected from the current sensor.

Meanwhile, the offset of the current sensor is generally changed by an external noise, aging, ambient temperature change and deterioration of the current sensor. Thus, a constant compensation of offset at the initial driving may inevitably cause generation of an error between a motor current detected by the current sensor and an actual motor current, leading to generation of pulsation and impossibility of stable motor control. Furthermore, if a mechanical resonance point of an entire system (EV) and a pulsating frequency of an output torque are synchronized, it is natural that the entire system is disadvantageously destabilized over time.

SUMMARY OF THE INVENTION

This section provides a general summary of the invention, and is not a comprehensive invention of its full scope or all of its features.

Exemplary aspects of the present invention are to substantially solve at least the above problems and/or disadvantages and to provide at least the advantages below. Accordingly, an aspect of the present invention provides an apparatus for compensating offset of current sensor configured to realize an adequate offset compensation by continuously re-calculating an offset of a current sensor, and a method thereof.

It should be emphasized, however, that the present invention is not limited to a particular invention, as explained above. It should be understood that other technical subjects not mentioned herein may be appreciated by those skilled in the art.

In one general aspect of the present invention, there is provided an apparatus for compensating offset of a current sensor detecting a motor current supplied by an inverter for PWM (Pulse Width Modulation) control of a motor, the apparatus comprising a current controller providing a PWM signal generated based on the motor current detected by the current sensor to the inverter, calculating an offset using the motor current detected by the current sensor in response to presence and absence of the PWM control of the motor, or offset-compensating the motor current detected by the current sensor.

In some exemplary embodiments, the current controller may calculate the offset by using the motor current, in a case the PWM control of the motor is discontinued.

In some exemplary embodiments, the current controller may offset-compensate the motor current detected by the current sensor, in a case the PWM control of the motor is performed.

In some exemplary embodiments, the current controller may calculate as an offset a current value of the motor current, in a case the PWM control of the motor is discontinued.

In another general aspect of the present invention, there is provided a method for compensating offset of a current sensor detecting a motor current supplied by an inverter for PWM (Pulse Width Modulation) control of a motor, the method comprising: determining whether a PWM control of the motor is performed; and performing an offset calculation or an offset compensation of the motor current detected by the current sensor as a result of the determination.

In some exemplary embodiments, the step of performing an offset calculation or an offset compensation of the motor current detected by the current sensor as a result of the determination may include calculating an offset by using the motor current detected by the current sensor, in a case the PWM control of the motor is discontinued.

In some exemplary embodiments, the step of performing an offset calculation or an offset compensation of the motor current detected by the current sensor as a result of the determination may include performing an offset compensation to the motor current detected by the current sensor, in a case the PWM control of the motor is continuously performed.

In some exemplary embodiments, a current value of the motor current may be calculated as an offset, in a case the PWM control of the motor is discontinued.

In some exemplary embodiments, the method may further comprise providing a PWM signal to the inverter, the PWM signal is generated from the offset-compensated motor current, in a case the PWM control of the motor is continuously performed.

The apparatus and method for compensating offset of a current sensor have an advantageous effect in that an adequate offset compensation can be realized to a current detected by a current sensor by frequently re-calculating an offset of the current sensor based on the current detected by the current sensor, in a case a current supply is discontinued from a motor by continuously determining the current supply from the motor.

Other exemplary aspects, advantages, and salient features of the invention will become more apparent to persons of ordinary skill in the art from the following detailed description, which, taken in conjunction with the annexed drawings, discloses exemplary embodiments of the invention.

The above and other features of the invention are discussed infra.

BRIEF DESCRIPTION OF THE DRAWINGS

The above and other features of the present invention will now be described in detail with reference to certain exemplary embodiments thereof illustrated in the accompanying drawings which are given hereinafter by way of illustration only, and thus are not limitative of the present invention, and wherein:

FIG. 2 is a flowchart illustrating a method for compensating offset of a current sensor according to an exemplary embodiment of the present invention.

Figure 1:
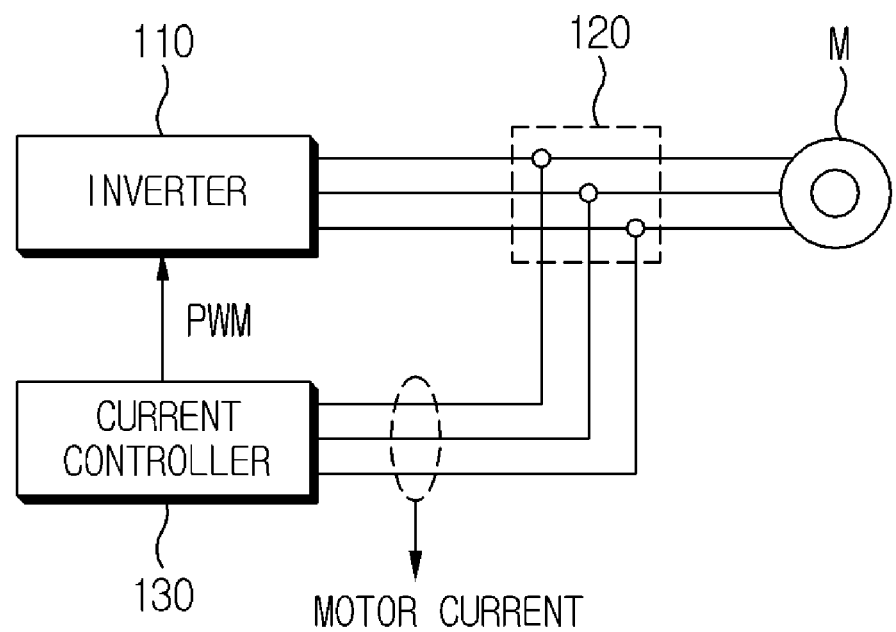
FIG. 1 is a block diagram illustrating an apparatus for compensating offset of a current sensor according to an exemplary embodiment of the present invention.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

DETAILED DESCRIPTION

Hereinafter, exemplary embodiments of the present invention will be described in detail with reference to the accompanying drawings.

In describing the present invention, detailed descriptions of constructions or processes known in the art may be omitted to avoid obscuring appreciation of the invention by a person of ordinary skill in the art with unnecessary detail regarding such known constructions and functions. Accordingly, the meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification.

The suffixes 'module', 'unit' and 'part' may be used for elements in order to facilitate the invention. Significant meanings or roles may not be given to the suffixes themselves and it is understood that the 'module', 'unit' and 'part' may be used together or interchangeably. That is, the terms "-er", "-or", "part" and "module" described in the specification mean units for processing at least one function and operation and can be implemented by hardware components or software components, and combinations thereof.

As used herein, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated. That is, in the drawings, the size and relative sizes of layers, regions and/or other elements may be exaggerated or reduced for clarity. Like numbers refer to like elements throughout and explanations that duplicate one another will be omitted.

The terminology used herein is for the purpose of describing particular embodiments only and is not intended to be limiting of the general inventive concept. As used herein, the singular forms "a", "an" and "the" are intended to include the plural forms as well, unless the context clearly indicates otherwise.

Unless specifically stated otherwise, as apparent from the following discussions, it should be understood that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

It will be understood that when an element is referred to as being "connected" or "coupled" to another element, it can be directly connected or coupled to the other elements or intervening elements may be present. In contrast, when an element is referred to as being "directly connected" or "directly coupled" to another element, there are no intervening elements present.

FIG. 1 is a block diagram illustrating an apparatus for compensating offset of a current sensor according to an exemplary embodiment of the present invention.

Referring to FIG. 1, an apparatus for compensating offset of a current sensor according to an exemplary embodiment of the present invention includes an inverter (110), a current sensor (120) and a current controller (130), where the current controller (130) may be one of elements forming a MCU (Motor Control Unit) for controlling a motor.

Meanwhile, although FIG. 1 illustrates only a schematic configuration related to driving of a motor (M) for explaining an apparatus for compensating offset of a current sensor, it should be apparent to the skilled in the art that the apparatus includes many more elements as used in HEVs and EVs that uses a motor (M) as a power supply source.

The inverter (110) serves to supply a driving current to a motor (M) by converting a DC (Direct Current) power to an AC (Alternating Current) power, and to PMW-control the motor (M) in response to a PWM signal supplied from the current controller (130). That is, the inverter (110) functions to switch a plurality of transistors formed at the inverter (110) in response to the PWM signal received from the current controller (130) and to convert the DC power to the AC power, where an AC current is supplied to the motor (M) and the motor (M) is PWM-controlled. At this time, the PWM control means to control a motor current supplied to the motor (M) in response to the PWM signal, where the motor current means a current flowing in the motor (M).

The current sensor (120) serves to detect a current supplied to the motor (M), that is, the motor current. The current sensor (120) is formed at a 3-phase wiring of the inverter (110) and the motor (M) to detect a current of each phase and feedback the current to the current controller (130). The current controller (130) determines the PWM control of the motor (M), and offset-compensates the motor current detected and returned from the current sensor (120), if the PWM control is being continuously performed on the motor (M). At this time, calculation of offset will be described later.

The current controller (130) serves to generate the PWM signal for controlling the switching of the plurality of transistors mounted at the inverter (110) based on the offset-compensated motor current, and to output the generated PWM signal to the inverter (110).

Meanwhile, the current controller (130) determines the PWM control of the motor (M), and calculates the offset based on the motor current detected by and returned from the current sensor (120), if the PWM control of the motor (M) is discontinued.

At this time, the discontinuation of the PWM control of the motor (M) means, for example, a case of standing of an electric vehicle during initial inspection for starting the electric vehicle, a case of generation of fail safety, and a case of generation of power latch. Thus, the discontinuation of the PWM control of the motor (M) corresponds to a case where the motor current is theoretically zero (0) in which where the inverter (110) does not drive the motor (M).

That is, if the PWM control of the motor (M) is discontinued, despite the fact the motor current detected by the currents sensor (120) must be zero (0), and if the motor current has a predetermined current value, the predetermined current value is calculated as an offset. The current controller (130) stores the calculated offset, and if the PWM control of the motor (M) is re-started, the current controller (130) offset-compensates the motor current in response to the stored offset to generate the PWM signal.

As apparent from the foregoing, the apparatus for compensating offset of a current sensor according to an exemplary embodiment of the present invention can perform the motor control based on an adequate motor current by re-calculating the offset frequently or at every predetermined period if the PWM control of the motor (M) is discontinued, instead of constantly compensating the offset predetermined at the time of initial driving of the motor (M).

FIG. 2 is a flowchart illustrating a method for compensating offset of a current sensor according to an exemplary embodiment of the present invention.

In a case an initial driving is performed on an electric vehicle (that is, in a case an electric vehicle is started), driving of the motor (M), the inverter (110), the current sensor (120) and the current controller (i.e., MCU, 130) is started (S210).

In a case the initial driving of the inverter (110) and the motor (M) is started, the current sensor (120) detects a current flowing in the motor (M) and returns the detected current to the current controller (130). The current controller (130) calculates an offset from the motor current detected by the current sensor (120) (S220).

Next, the current controller (130) continuously determines whether the PWM control of the motor (M) is performed (S230). That is, the current controller (130) determines whether the inverter (110) supplies a motor current for driving the motor (M). This determination may be periodically realized at every predetermined time interval, or may be realized frequently at an arbitrary time period.

As a result of the determination at S220, if it is determined that the PWM control of the motor (M) is performed, the current controller (130) offset-compensates the motor current detected by the current sensor (120) in response to the offset calculated by S220 (S240). The offset may have a positive (+) value or a negative (−) value, and the offset compensation may be realized by adding the offset to the motor current detected by the current sensor (20), or deducting the offset from the motor current detected by the current sensor (120).

In a case the offset compensation to the motor current is completed, the current controller (130) generates a PWM signal based on the motor current offset-compensated at S240 (S250), and outputs the generated PWM signal to the inverter (110), whereby the motor current (AC signal) is supplied to the motor (M) (S260).

Meanwhile, as a result of the determination at S230, if it is determined that the PWM control of the motor (M) is not performed, flow returns to S220, where the current controller (130) calculates a new offset from the motor current detected by the current sensor (120).

At this time, this case is where the PWM control of the motor (M) is discontinued, and a motor current flowing in the motor (M) must be zero (0), but if a current value (not zero) having a predetermined current value is outputted from the current sensor (120), the current value at this time is calculated as a new offset.

That is, the new offset is calculated in response to offset changes such as an external noise, aging, ambient temperature changes and the like. If the new offset thus described is generated, the current controller (130) repeatedly performs the steps from S230 to S260 to stably control the motor (M).

The above-mentioned apparatus and method for compensating offset of a current sensor according to the present invention may, however, be embodied in many different forms and should not be construed as limited to the embodiments set forth herein. Thus, it is intended that embodiments of the present invention may cover the modifications and variations of this invention provided they come within the scope of the appended claims and their equivalents.

While particular features or aspects may have been disclosed with respect to several embodiments, such features or aspects may be selectively combined with one or more other features and/or aspects of other embodiments as may be desired.

The above-mentioned apparatus and method for compensating offset of a current sensor according to the present invention has an industrial applicability in that an adequate offset compensation can be realized to a current detected by a current sensor by frequently re-calculating an offset of the current sensor based on the current detected by the current sensor, in a case a current supply is discontinued from a motor by continuously determining the current supply from the motor.

What is claimed is:

1. An apparatus for compensating offset of a current sensor detecting a motor current supplied by an inverter for PWM (Pulse Width Modulation) control of a motor, the apparatus comprising:
   a current controller calculating an offset using the detected motor current or offset-compensating the detected motor current according to the determination,
   wherein the current controller calculates the offset when the PWM control is not performed.

2. The apparatus of claim 1, wherein the current controller offset-compensates the detected motor current when the PWM control is performed.

3. The apparatus of claim 2, wherein the current controller provides a PWM signal to the inverter that is generated from the offset-compensated motor current when the PWM control is performed.

4. The apparatus of claim 1, wherein the current controller calculates a current value of the motor current as the offset when the PWM control is not performed.

5. A method for compensating offset of a current sensor detecting a motor current supplied by an inverter for PWM (Pulse Width Modulation) control of a motor, the method comprising:
   determining whether a PWM control of the motor is performed; and
   performing either an offset calculation using the detected motor current or an offset-compensation of the detected motor current according to the determination,
   wherein the offset is calculated when the PWM control is not performed.

6. The method of claim 5, wherein the offset compensation is preformed when the PWM control is performed.

7. The method of claim 6, further comprising providing a PWM signal to the inverter that is generated from the offset-compensated motor current when the PWM control is performed.

8. The method of claim 5, wherein a current value of the motor current is calculated as the offset when the PWM control is not performed.

* * * * *